(12) United States Patent
Bobba et al.

(10) Patent No.: US 7,155,695 B2
(45) Date of Patent: Dec. 26, 2006

(54) SIGNAL SHIELDING TECHNIQUE USING ACTIVE SHIELDS FOR NON-INTERACTING DRIVER DESIGN

(75) Inventors: Sudhakar Bobba, Sunnyvale, CA (US); Tyler Thorp, Sunnyvale, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 842 days.

(21) Appl. No.: 10/071,379

(22) Filed: Feb. 6, 2002

(65) Prior Publication Data

US 2003/0147189 A1    Aug. 7, 2003

(51) Int. Cl.
*G06F 17/50* (2006.01)

(52) U.S. Cl. .............. 716/12; 716/13; 716/14

(58) Field of Classification Search .......... 716/1–11, 716/12–15; 326/21, 15, 101; 327/290, 565
See application file for complete search history.

(56) References Cited

U.S. PATENT DOCUMENTS

| | | | | |
|---|---|---|---|---|
| 5,596,506 A | * | 1/1997 | Petschauer et al. | 716/5 |
| 5,699,308 A | | 12/1997 | Wada et al. | 365/200 |
| 6,061,222 A | * | 5/2000 | Morris et al. | 361/111 |
| 6,184,702 B1 | * | 2/2001 | Takahashi et al. | 326/21 |
| 6,211,456 B1 | * | 4/2001 | Seningen et al. | 174/27 |
| 6,212,091 B1 | | 4/2001 | Kawabata et al. | 365/63 |
| 6,229,095 B1 | * | 5/2001 | Kobayashi | 174/255 |
| 6,285,208 B1 | * | 9/2001 | Ohkubo | 326/15 |
| 6,353,917 B1 | * | 3/2002 | Muddu et al. | 716/6 |
| 6,414,542 B1 | * | 7/2002 | Lin et al. | 327/565 |
| 6,456,117 B1 | * | 9/2002 | Tanaka | 326/101 |
| 6,456,137 B1 | * | 9/2002 | Asao | 327/290 |
| 6,499,131 B1 | * | 12/2002 | Savithri et al. | 716/5 |
| 6,510,545 B1 | * | 1/2003 | Yee et al. | 716/12 |
| 6,611,944 B1 | * | 8/2003 | Elzinga | 716/2 |
| 2001/0021118 A1 | | 9/2001 | Kasa | 365/63 |
| 2004/0046588 A1 | * | 3/2004 | Tetelbaum | 326/39 |

OTHER PUBLICATIONS

Notification of Transmittal of The International Search Report Or The Declaration dated Jun. 9, 2004 (6 pages).

* cited by examiner

*Primary Examiner*—Jack Chiang
*Assistant Examiner*—Magid Y. Dimyan
(74) *Attorney, Agent, or Firm*—Osha Liang LLP

(57) ABSTRACT

A technique for actively shielding a signal such that a signal driver of the signal only participates in discharge events is provided. Because the signal driver only participates in discharge events, the signal driver is non-interacting with respect to other driver devices. Shield wires are set such that an active transition on the signal causes a discharge of capacitance between the signal and the shield wires.

14 Claims, 4 Drawing Sheets

Low To High

High To Low

SIGNAL SHIELDING TECHNIQUE USING ACTIVE SHIELDS FOR NON-INTERACTING DRIVER DESIGN

BACKGROUND OF INVENTION

A typical computer system includes at least a microprocessor and some form of memory. The microprocessor has, among other components, arithmetic, logic, and control circuitry that interpret and execute instructions necessary for the operation and use of the computer system. FIG. 1 shows a typical computer system (10) having a microprocessor (12), memory (14), integrated circuits (16) that have various functionalities, and communication paths (18), i.e., buses and wires, that are necessary for the transfer of data among the aforementioned components of the computer system (10).

The various computations and operations performed by the computer system are facilitated through the use of signals that provide electrical pathways for data to propagate between the various components of the computer system. In a general sense, the passing of data onto a signal may occur by either raising the voltage of the signal or reducing the voltage of the signal. When the voltage is raised, the signal is said to be at a "logic high," and when the voltage is reduced, the signal is said to be at a "logic low." Changes in the voltage value of a signal are accomplished by charging and discharging capacitors associated with the signal wire on which the signal resides. A capacitor with a potential difference across its terminals is considered to be a charged capacitor, and a capacitor with no potential difference across its terminals is considered to be a discharged capacitor. Therefore, a charging event is described as a process by which potential difference is created across the terminals of a capacitor by delivering charge to the capacitor. A discharging event is described as a process by which the potential difference across the terminals of a capacitor is removed by removing the charge stored in the capacitor.

Because signals within an integrated circuit are often in close proximity to each other, there is a propensity for the behavior of one signal to affect the behavior of another signal. This occurs due to intrinsic capacitances (also referred to and known as "cross-coupling capacitance") that develop between signals at different logic levels. For example, some amount of cross-coupling capacitance is likely to develop between two signals that are relatively close together, where one signal is at a logic high and the other is at a logic low. When one of the signals switches state, noise may be injected on the other signal, causing the other signal to glitch, i.e., an electrical spike occurs. Such undesired behavior on the non-switching signal may lead to performance degradation because the noise injected on the non-switching signal can propagate to other parts of the processor causing timing failures and/or circuit malfunction.

An approach that designers have used to combat such cross-coupling capacitance induced behavior involves the use of wires to "shield" a signal from other signals. The purpose of shielding is to place wires next to the signal wire that do not make any transitions. To this end, FIG. 2 shows a typical signal shield implementation. In FIG. 2, a signal driver (20) outputs a signal (22) that is shielded by a first wire (24) and a second wire (26), where the first wire (24) is operatively connected to logic high, i.e., a voltage source (28), and the second wire (26) is operatively connected to logic low, i.e., ground (30). The signal driver (20) is also connected to power supply terminals (36, 38); however, the power supply terminals (36, 38) of the signal driver (20) may be different from the power supply terminals (28, 30) of the shield wires (24, 26). In any event, the placement of the shield wires (24, 26) creates capacitances (32, 34) between the respective shield wires (24, 26) and the signal wire (22). In sum, because of such a signal shield implementation, other signals in close proximity to the signal (22) are not affected by the switching behavior of the signal (22) due to the fact that the signal (22) is shielded by wires (24, 26) that have constant values when the signal (22) switches state.

Referring now to FIG. 2b, when the signal (22) transitions from low to high, charge is delivered from the power supply terminal (36) of the signal driver (20) to the signal (22) and on to the second wire (26). As shown by the charge paths in FIG. 2b, charge flows through the capacitors (34) between the signal (22) and the second wire (26) to the ground terminal (30) of the second wire (26). Thus, in effect, the capacitors (34) between the signal (22) and the second wire (26) get charged. Alternatively, as shown by the discharge paths in FIG. 2b, the delivery of charge to the signal (22) causes the capacitors (32) between the signal (22) and the first wire (24) to discharge due to the capacitors (32) getting subjected to equal voltage terminals.

Referring now to FIG. 2c, when the signal (22) transitions from high to low, charge is delivered from the power supply terminal (28) of the first wire (28) to the signal (22) and to the ground terminal (38) of the signal driver (20). As shown by the charge paths in FIG. 2c, charge flows through the capacitors (32) between the first wire (24) and the signal (22) to the ground terminal (38) of the signal driver (20). Thus, in effect, the capacitors (32)1 between the first wire (24) and the signal (22) get charged. Alternatively, as shown by the discharge paths in FIG. 2c, the delivery of charge to the signal (22) causes the capacitors (34) between the signal (22) and the second wire (26) to discharge due to the capacitors (34) getting subjected to equal voltage terminals.

Referring now to both FIGS. 2b and 2c, because charge is drawn by particular capacitors when the signal driver (20) switches the state of the signal (22), a charging event is said to be a "global event" in that the charging of the capacitors by the signal (22) interacts with the distribution of charge to capacitors positioned elsewhere in an integrated circuit. In other words, a charging event requires charge sharing among particular capacitors in the integrated circuit. Thus, during a charging event, there is a potential chance of switching drivers interacting with each other and adversely affecting the performance and behavior of other signal drivers.

SUMMARY OF INVENTION

According to one aspect of the present invention, an integrated circuit comprises a signal driver that generates a signal, a first wire disposed adjacent to the signal, and shield control circuitry that generates a value on the first wire such that a transition on the signal causes a discharge of capacitance between the signal and the first wire.

According to another aspect, an integrated circuit comprises driving means for generating a signal, and shielding control means for actively controlling a value of wires shielding the signal such that the driving means only participates in discharge events.

According to another aspect, a method for non-interactively driving a signal comprises after a signal has transitioned to a first voltage potential, charging a capacitor by driving a wire to a second voltage potential, where the wire shields the signal; and discharging the capacitor when the signal transitions to the second voltage potential.

Other aspects and advantages of the invention will be apparent from the following description and the appended claims.

BRIEF DESCRIPTION OF DRAWINGS

FIG. 2b shows charge flow during a low to high signal transition in the typical signal shield implementation shown in FIG. 2a.

FIG. 2c shows charge flow during a high to low signal transition in the typical signal shield implementation shown in FIG. 2a.

FIG. 3b shows a timing diagram in accordance with the embodiment shown in FIG. 3a.

DETAILED DESCRIPTION

Embodiments of the present invention relate to an apparatus for shielding signals using non-interacting drivers and active shields. Embodiments of the present invention further relate to a method for dynamically shielding a signal so as to make a signal driver of the signal non-interacting with another signal driver.

More particularly, the present invention relates to a signal shielding implementation in which active shields are used such that a driver of a signal always performs a discharge event. A discharge event, as opposed to a charging event, requires the flow of current through local loops. This type of event is non-interacting with respect to one or more signal drivers because discharge events are not global events. In other words, a signal driver that always performs discharge events does not interact with, or otherwise adversely affect, other signal drivers. In order to ensure that the signal driver always performs a discharge event, the present invention uses circuitry to dynamically control the value of wires that shield the signal such that the shield wires are always at a voltage potential of a final value of an active transition on the signal.

Those skilled in the art will appreciate that for purposes of the present invention, references to a "signal driver" may refer to a transistor, a gate, or any other circuit component that outputs, or drives, a signal.

Figure 1:
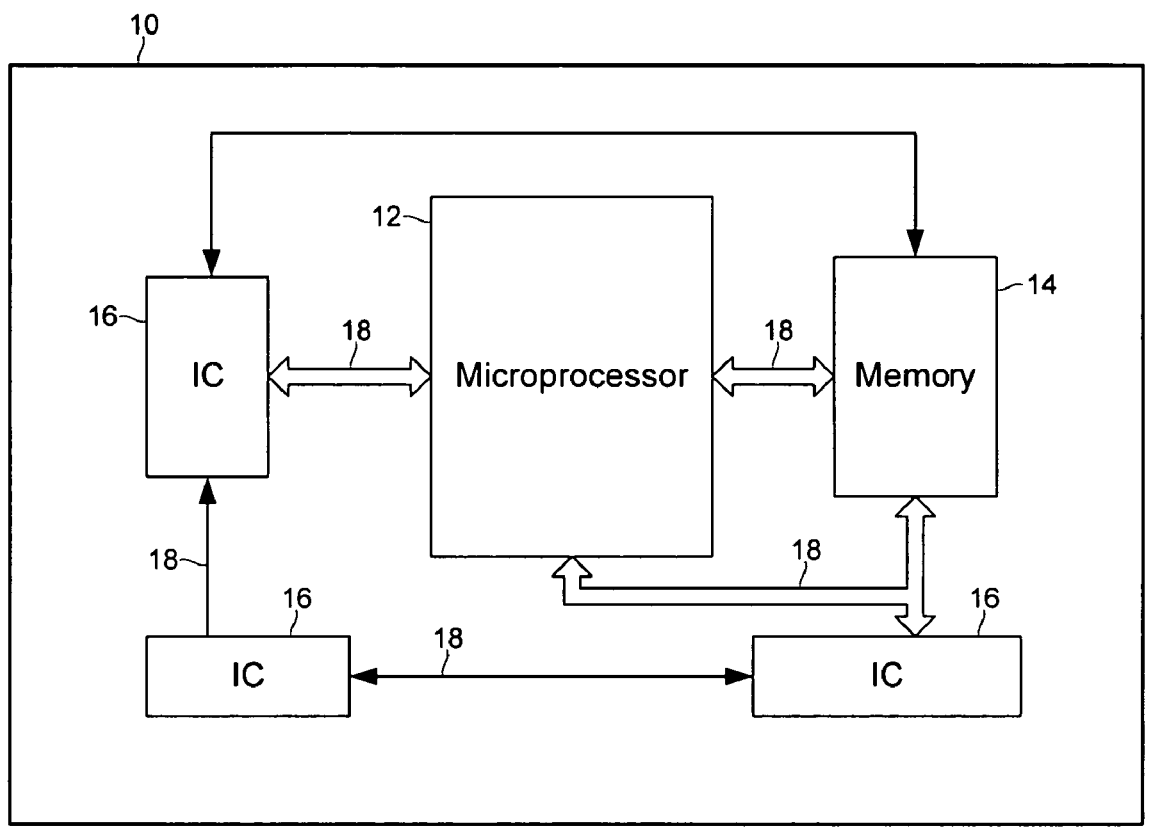
FIG. 1 shows a typical computer system.
Figure 2A:
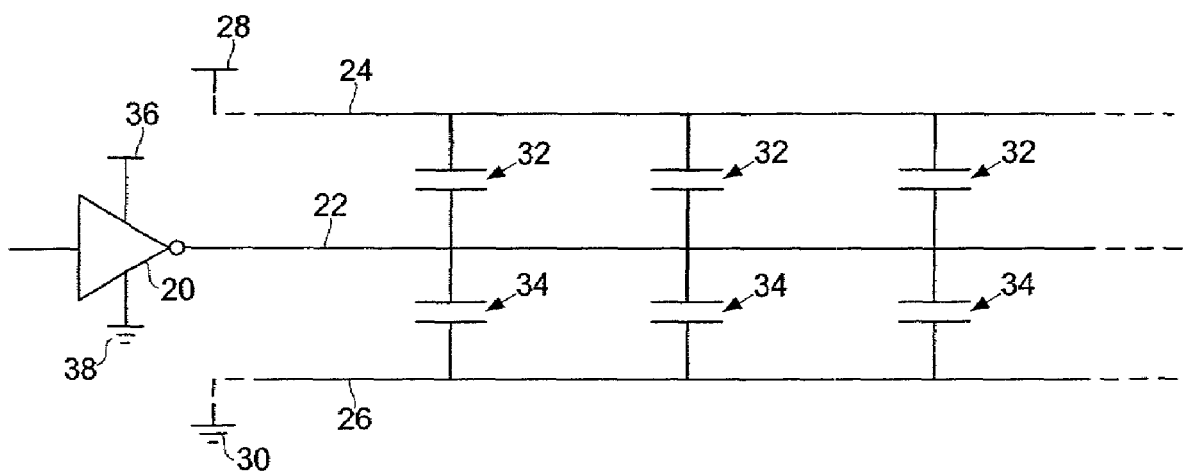
FIG. 2a shows a typical signal shield implementation.
Figure 2B:
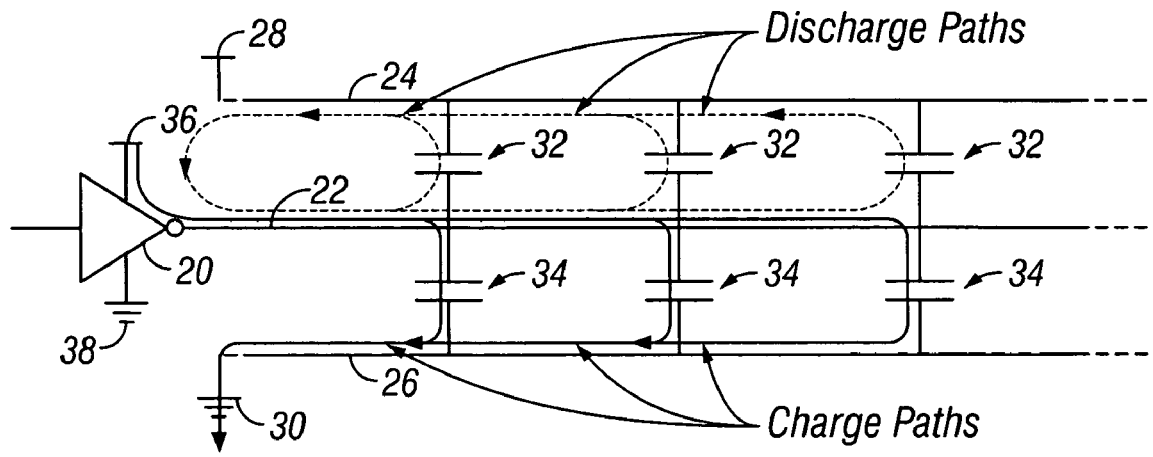
Figure 2C:
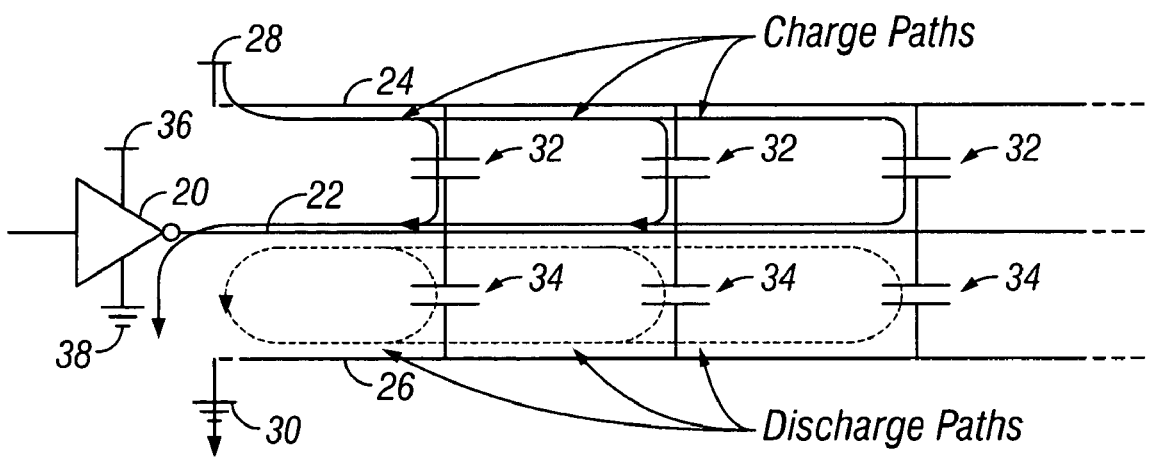
Figure 3A:
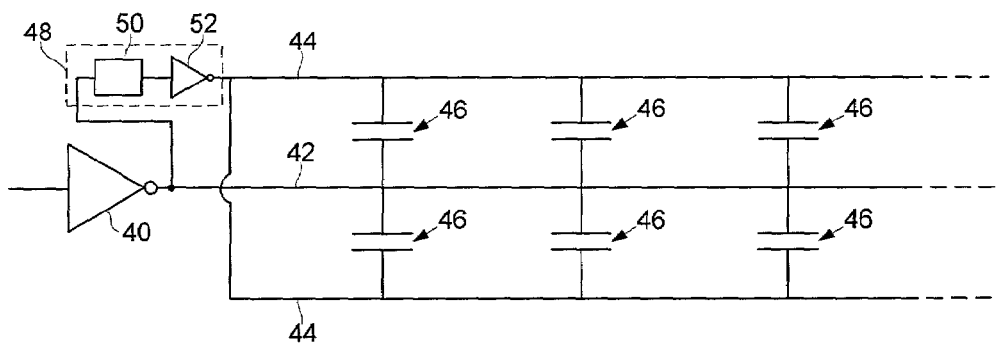
FIG. 3a shows a signal shielding implementation in accordance with an embodiment of the present invention.

FIG. 3a shows an exemplary signal shielding technique in accordance with an embodiment of the present invention. In FIG. 3a, a signal driver (40) generates a signal (42) that is shielded by wires (44) having the same value. In other words, the shield wires (44) on either side of the signal (42) are connected. Cross-coupling capacitors (46) are implicitly positioned between the signal (42) and the shield wires (44).

A shield control stage (48) formed by a delay element (50) and a shield driver (52) is used to charge the capacitors (46) in advance of a discharge event initiated by the signal driver (40). For example, if the signal (42) is initially low, and then later on the signal driver (40) causes the signal (42) to transition to high, the shield control stage (48), prior to the signal driver (40) driving the signal (42) high, sets the value of the shield wires (44) high to ensure that the transition of the signal (42) to high causes a discharge event. Alternatively, if the signal (42) is initially high, and then later on the signal driver (40) causes the signal (42) to transition to low, the shield control stage (48), prior to the signal driver (40) driving the signal (42) high, sets the value of the shield wires (44) low to ensure that the transition of the signal (42) to low causes a discharge event.

The delay element (50) in FIG. 3a is used to generate a delay that compensates for signal propagation time on the signal (42), and which then initiates a charging event on the shield wire (44). For example, when the signal driver (40) drives a logic low onto the signal (42), the shield control stage (48) subsequently sets the value of the shield wires (44) to high in preparation for the next active transition on the signal (42). Thus, the delay generated by the delay element (50) is used to ensure that there is enough time for the initial low value on the signal (42) to propagate down the signal (42) before the shield control stage (48) sets the high value on the shield wire. This helps ensure that the signal driver (40) only performs discharge events.

Those skilled in the art will appreciate that a delay, for the purposes described above, may also be generated by other synchronous and/or asynchronous signals. Further, those skilled in the art will appreciate that the shield driver (52) may be any type of inverting gate or circuit.

Figure 3B:
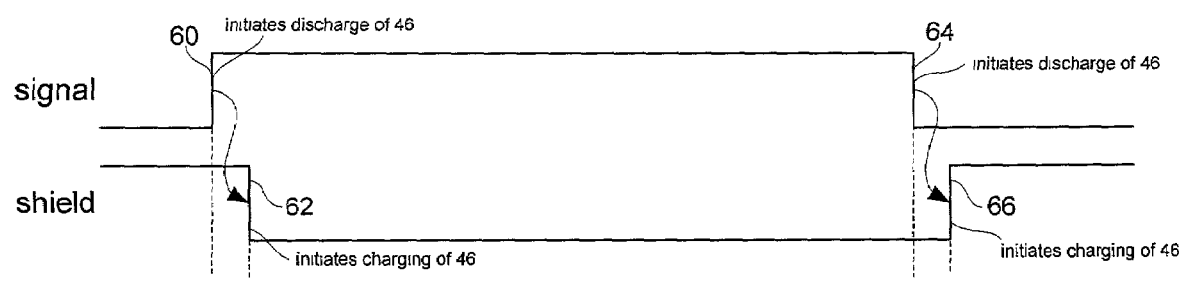

FIG. 3b shows an exemplary timing diagram in accordance with the embodiment shown in FIG. 3a. Particularly, FIG. 3b shows timing waveforms for the signal (42) (labeled in FIG. 3b as signal) and the shield wires (44) (labeled in FIG. 3b as shield).

In FIG. 3b, the signal (42) is initially low and the shield wires (44) are high. Thus, the capacitors (46) between the signal (42) and the shield wires (44) are being, or are already, charged up. Then, the signal (42) transitions high (60). At this point, the signal (42) and the shield wires (44) are at the same potential, and thus, the capacitors (46) are discharged. As the high transition propagates down the signal (42) and as the capacitors (46) discharge, the shield control stage (48) causes the shield wires (44) to transition low (62).

As the shield wires (44) transition low (62), the capacitors (46) are charged back up due to the signal (42) and shield wires (44) being at different potentials. Thus, in effect, the shield wires (44), and not the signal (42), initiate the charging events. When the signal (42) transitions low (64), the low value on the signal (42) causes the discharge of the capacitors (46) because the shield wires (44) are also low. As the low transition propagates down the signal (42) and as the capacitors (46) discharge, the shield control stage (48) causes the shield wires (44) to transition high (66) in preparation for the next transition on the signal (42).

Thus, as evident from the timing diagram in FIG. 3b, active transitions on the signal (42) always cause discharge events, and thus, the signal driver (40) is non-interacting with respect to other driver devices due to the signal driver (40) not participating in charging events. Further, the shield control stage (48) actively controls the value on the shield wires (44) to ensure that the signal driver (40) participates only in discharge events.

Advantages of the present invention may include one or more of the following. In some embodiments, because a signal driver only performs discharge events, the signal driver may be non-interacting with respect to other signal drivers.

In some embodiments, because a signal driver that drives an actively shielded signal does not participate in charging events, the signal driver does not interact with other transitioning components in close proximity to the signal driver.

In some embodiments, because a signal driver is non-interacting, noise and variations in delay on the signal driven by the signal driver may be reduced, or eliminated, effectively increasing integrated circuit performance.

In some embodiments, because behavior of a signal driver is isolated from other driver devices, noise and variations in delay on the signal driven by the signal driver may be reduced, or eliminated, effectively increasing integrated circuit performance.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. An integrated circuit, comprising:
    a signal driver that generates a signal on a signal path;
    a first wire disposed adjacent to the signal path; and
    shield control circuitry that, after a transition on the signal path, causes the first wire to transition to a value that causes a charge up of capacitance between the signal path and the first wire, wherein a subsequent transition on the signal path causes a discharge of capacitance between the signal path and the first wire.

2. The integrated circuit of claim 1, further comprising a capacitor having one terminal operatively connected to the signal path and another terminal operatively connected to the first wire.

3. The integrated circuit of claim 1, wherein the signal driver is a transistor.

4. The integrated circuit of claim 1, wherein the signal driver is a gate.

5. The integrated circuit of claim 1, wherein the shield control circuitry is dependent on the signal driver.

6. The integrated circuit of claim 1, further comprising a second wire disposed adjacent to the signal path, wherein the first and second wires are used to shield the signal path.

7. The integrated circuit of claim 6, wherein the shield control circuitry comprises inverting circuitry that outputs onto the first and second wires dependent on a synchronous signal input to the shield control circuitry.

8. The integrated circuit of claim 6, wherein the shield control circuitry comprises inverting circuitry that outputs onto the first and second wires dependent on an asynchronous signal input to the shield control circuitry.

9. The integrated circuit of claim 6, wherein the shield control circuitry comprises:
    a delay element; and
    inverting circuitry that outputs onto the first and second wires.

10. The integrated circuit of claim 9, wherein the delay element generates a delay greater than a signal propagation delay of the signal.

11. An integrated circuit, comprising:
    driving means for generating a signal on a signal path ; and
    shielding control means for actively controlling a value on wires shielding that signal path such that the driving means only participates in discharge events.

12. A method for non-interactively driving a signal on a signal path, comprising:
    after the signal on the signal path has transitioned to a first voltage potential, charging a capacitor by causing a wire to transition to a second voltage potential, wherein the wire shields the signal path ; and
    discharging the capacitor when the signal path transitions to the second volt potential.

13. The method of claim 12, wherein the capacitor has one terminal operatively connected to the wire and another terminal operatively connected to the signal path.

14. The method of claim 12, further comprising selectively delaying the driving of the wire to the second potential.

* * * * *